(12) United States Patent
Tanaka et al.

(10) Patent No.: US 7,542,201 B2
(45) Date of Patent: Jun. 2, 2009

(54) SEMICONDUCTOR OPTICAL AMPLIFICATION DEVICE AND OPTICAL INTEGRATED CIRCUIT

(75) Inventors: Shinsuke Tanaka, Kawasaki (JP); Ken Morito, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/360,660

(22) Filed: Feb. 24, 2006

(65) Prior Publication Data

US 2007/0047068 A1 Mar. 1, 2007

(30) Foreign Application Priority Data

Aug. 31, 2005 (JP) ............... 2005-252277

(51) Int. Cl.
*H01S 5/00* (2006.01)
*H01S 5/343* (2006.01)

(52) U.S. Cl. ............. 359/344; 372/45.011; 372/45.012; 438/604

(58) Field of Classification Search ............... 359/344; 438/604; 372/45.011–45.013
See application file for complete search history.

(56) References Cited

U.S. PATENT DOCUMENTS

| | | | | |
|---|---|---|---|---|
| 5,151,818 A | * | 9/1992 | Thijs et al. ............... | 359/344 |
| 5,253,264 A | * | 10/1993 | Suzuki et al. ........... | 372/45.012 |
| 6,229,152 B1 | * | 5/2001 | Dries et al. ................ | 257/17 |
| 6,765,238 B2 | * | 7/2004 | Chang et al. ............... | 257/104 |
| 2004/0196540 A1 | * | 10/2004 | Lealman et al. ............ | 359/344 |
| 2005/0041708 A1 | * | 2/2005 | Fujishiro et al. ............ | 372/43 |

FOREIGN PATENT DOCUMENTS

| | | | |
|---|---|---|---|
| JP | 07263812 A | * | 10/1995 |
| JP | 8-95094 | | 4/1996 |
| JP | 09298338 A | * | 11/1997 |
| JP | 10190143 A | * | 7/1998 |
| JP | 10242571 A | * | 9/1998 |
| JP | 2000-101199 | | 4/2000 |

OTHER PUBLICATIONS

Madelung (editor), Semiconductors—Basic Data, 2nd revised Edition, Spinger-Verlag, Berlin, pp. 104, 127, 136, & 151 (1996).*
Jeong et al., "Analysis and assessment of the gain of optically pumped surface-normal optical amplifiers," Optics Communications, vol. 136, No. 4, Feb. 15, 1997.
Spiekman et al., "All-Optical Mach-Zehnder wavelength converter with monolithically integrated DFB probe source," IEEE Photonics Technology Letters, vol. 9, No. 10, Oct. 1997, 3 pp.

(Continued)

*Primary Examiner*—Eric Bolda
(74) *Attorney, Agent, or Firm*—Kratz, Quintos & Hanson, LLP.

(57) ABSTRACT

A semiconductor optical amplification device is disclosed that has a gain spectrum of a wide bandwidth. The semiconductor optical amplification device includes an InP substrate and an active layer on the InP substrate. The active layer has a quantum well structure formed by alternately stacking a barrier layer and a well layer, the barrier layer is formed from a tensile-strained InGaAs film, and the well layer is formed from a compressively-strained InGaAs film.

8 Claims, 9 Drawing Sheets

OTHER PUBLICATIONS

K. Magari et al., "Polarization-Insensitive Optical Amplifier with Tensile-Strained-Barrier MQW Structure," IEEE Journal of Quantum Electronics, vol. 30, No. 3, Mar. 1994, pp. 695-702.

A. Godefroy et al., "1.55-μm Polarization-Insensitive Optical Amplifier with Strain-Balanced Superlattice Active Layer," IEEE Photonics Technology Letters, vol. 7, No. 5, May 1995, pp. 473-475.

A. Ougazzaden et al., Atmospheric pressure MOVPE growth of high performance polarisation insensitive strain compensated MQW InGaAsP/InGaAs optical amplifier, Electronics letters, vol. 31, No. 15, Jul. 1995, pp. 1242-1244.

Seoijin Park et al., "Semiconductor Optical Amplifier for CWDM Operating Over 1540-1620 nm," IEEE Photonics Technology Letters, vol. 17, No. 5, May 2005, pp. 980-982.

Ken Morito et al., "High-Output-Power Polarization-Insensitive Semiconductor Optical Amplifier," Journal of Lightwave Technology, vol. 21, No. 1, Jan. 2003, pp. 176-181.

* cited by examiner

SEMICONDUCTOR OPTICAL AMPLIFICATION DEVICE AND OPTICAL INTEGRATED CIRCUIT

BACKGROUND OF THE INVENTION

1. Field of the Invention

The present invention relates to a semiconductor optical amplification device and an optical integrated circuit, and more particularly, to a semiconductor optical amplification device an active layer of which has a quantum-well structure, and an optical integrated circuit using the semiconductor optical amplification device.

2. Description of the Related Art

Along with rapidly increasing needs of communication in recent years and continuing, information transmission devices of high speed and large capacity are more and more required. A photonic network employs optical time division multiplexing, wavelength division multiplexing, and optical code division multiplexing techniques to process light waves, and is able to transmit information of large capacity at high speed through optical fibers. In addition, a photonic gateway technique is being developed which enables direct transmission of optical signals between photonic networks of different scales and different signal formats without the necessity of converting the optical signals into electronic signals. Because of the photonic gateway technique, it is expected that the processing speed will be boosted up, and communications at even higher speeds will be realized.

Semiconductor optical amplifiers are used in the photonic network and the photonic gateway, and play an important role because of compactness and high performance thereof. Additionally, the semiconductor optical amplifiers are important because they can be formed on the same semiconductor substrate with a laser or an optical modulator.

When using a semiconductor optical amplifier in the photonic network, basically, it is required that the semiconductor optical amplifier have a gain in a wide wavelength range, and the gain have little wavelength dependence. In order to meet this requirement, a semiconductor optical amplifier has been proposed in which an active layer has a multiple quantum well structure.

The active layer of the multiple quantum well structure possesses a step-like density function, and includes a flat gain spectrum in a wide wavelength range compared to a bulk active layer in the related art. Further, the active layer of the multiple quantum well structure has a small differential gain at a longer wavelength region relative to its maximum gain wavelength, thus, high saturation light output is obtainable.

Usually, the bandwidth of an ASE (Amplified Spontaneous Emission) spectrum amplified by the semiconductor optical amplifier is used as an index for describing the band of the gain spectrum of the semiconductor optical amplifier. The ASE spectrum $P_{ASE}(\lambda)$ can be expressed as below by using the gain spectrum $G(\lambda)$.

$$P_{ASE}(\lambda) = (G(\lambda)-1)n_{sp(eff)}h\nu d\nu$$

where, $n_{sp(eff)}$ is an effective inversion parameter, $h\nu$ is photon energy at the observed wavelength, and $d\nu$ is an observed ASE bandwidth.

In an ideal semiconductor optical amplifier at highly current injected condition, the effective inversion parameter $n_{sp(eff)}$ becomes 1 in a wide wavelength range, thus the wavelength dependence is negligible. The shape of the gain spectrum $G(\lambda)$ has very close relation to the ASE spectrum $P_{ASE}(\lambda)$.

From the above descriptions, it is specified that a bandwidth between two wavelengths corresponding to a value of the light intensity equaling −3 dB relative to a peak value of the light intensity of the ASE spectrum $P_{ASE}(\lambda)$ is used as an index to describe the band of the gain spectrum of the semiconductor optical amplifier. This bandwidth is referred to as "3 dB bandwidth".

In the semiconductor optical amplifier having an active layer of a multiple quantum well structure, a gain coefficient of the active layer depends on the guide mode, and hence, a light confinement coefficient changes along with the guide mode. For this reason, the gain of the semiconductor optical amplifier, which is influenced by the product of the gain coefficient and the optical confinement coefficient, is different between different polarization modes; specifically, the gain of the semiconductor optical amplifier is different between the TE mode and TM mode. The difference is referred to as "polarization-dependent gain (PDG)" (hereinafter, referred to as PDG). Because the polarization-dependent gain is not desirable in practical use of the semiconductor optical amplifier, some methods have been proposed to reduce this gain difference of semiconductor optical amplifiers.

A semiconductor optical amplifier able to reduce the polarization dependence of the gain has been proposed, in which an active layer is formed by alternately stacking a tensile strained $In_{0.28}Ga_{0.72}As$ barrier layer and un-strained $In_{0.53}Ga_{0.47}As$ well layer on an InP substrate. For example, reference can be made to K. Magari et al., IEEE J. Quantum Electronics, vol. 30, No. 3, p. 695-702(1994) (hereinafter, referred to as "reference 1").

In the active layer having such a multiple quantum-well structure, because of the tensile strain applied on the barrier layer, a band structure of the barrier layer is modified. Specifically, energy levels of light holes are higher than energy levels of heavy holes in the valence band of the barrier layer. Due to this, stimulated emission by recombination of the light holes and electrons occurs, and primarily the gain of the TM mode is generated in the barrier layer. On the other hand, in the well layer, similar to common multiple quantum-well structures, primarily the gain of the TE mode is generated.

By controlling the tensile strain applied on the barrier layer and the thicknesses of the layers in the semiconductor optical amplifier, it is possible to reduce the PDG.

Further, a well layer formed from an InGaAsP film is disclosed in A. Godefroy et. al., IEEE Photonics Technology Letters, vol. 7, No. 5, p. 473-475(1995) (hereinafter, referred to as "reference 2"), and A. Ougazzaden et al., Electronics Letters, vol. 31, No. 15, p. 1242-1244(1995) (hereinafter, referred to as "reference 3").

Further, semiconductor optical amplifiers able to reduce the polarization dependence of the gain are disclosed in reference 2 and reference 3. In these semiconductor optical amplifiers, the active layer is formed by alternately stacking an InGaAs barrier layer and a InGaAsP well layer. A tensile strain is applied to the InGaAs barrier layer, and a compression strain is applied to InGaAsP well layer.

Similar to the semiconductor optical amplifier disclosed in reference 1, the semiconductor optical amplifiers disclosed in reference 2 and 3 are also able to reduce the polarization dependence of the gain, that is, the PDG.

However, in the semiconductor optical amplifier disclosed in reference 1, the 3 dB bandwidth of the ASE spectrum is only 55 nm in the TE mode and 70 nm in the TM mode, and they are not sufficient for realizing a wide bandwidth.

Further, in references 2 and 3, the well layer is formed from an InGaAsP film. As described with respect to FIG. 1, such a structure suffers from some problems.

FIG. 1 is a diagram illustrating a band structure of the active layer of a semiconductor optical amplifier in the related art, specifically, as those shown in references 2 and 3.

As shown in FIG. 1, because of phosphorous (P) existing in the well layer, the energy gap of the well layer increases, and the electron quantum level goes higher. As a result, the energy difference between the electron quantum level of the well layer and the lower compression strain of the conduction band of the barrier layer $\Delta Ec$ (this is also referred to as "effective barrier height") is not sufficiently large. For example, in reference 3, the effective barrier height $\Delta Ec$ is 10 meV, which is even less than the thermal energy at 27° C. (26 meV). Hence, it is thought that many electrons leak out from the quantum well due to the thermal energy and stay in the barrier layer. The electrons in the barrier layer combine with the light holes or the heavy holes, and this produces stimulated emission. This stimulated emission generates a gain spectrum of a narrow bandwidth, similar to the bulk active layer in the related art. For this reason, such kind of semiconductor optical amplifier cannot produce a gain spectrum of a sufficiently wide bandwidth.

SUMMARY OF THE INVENTION

Accordingly, it is a general object of the present invention to solve one or more of the above problems of the related art.

A more specific object of the present invention is to provide a semiconductor optical amplification device having a gain spectrum of a wide bandwidth, and an optical integrated circuit using the semiconductor optical amplification device.

According to a first aspect of the present invention, there is provided a semiconductor optical amplification device, comprising an InP substrate; and an active layer formed on the InP substrate, wherein the active layer has a quantum well structure formed by alternately stacking a barrier layer and a well layer, the barrier layer is formed from a tensile-strained InGaAs film, and the well layer is formed from a compressively-strained InGaAs film.

According to an embodiment of the present invention, the active layer has a quantum well structure formed by alternately stacking a barrier layer and a well layer, the barrier layer is formed from a tensile-strained InGaAs film, and the well layer is formed from a compressively-strained InGaAs film. The InGaAs well layer has a narrow energy band compared to an InGaAsP well layer with the InGaAsP film being obtained by adding phosphorous into InGaAs. Due to this, the energy difference between the electron quantum level of the well layer and the lower edge of the conduction band of the barrier layer $\Delta Ec$ (effective barrier height) increases. Thus, it is possible to reduce the number of electrons leaking out from the well layer due to the thermal energy, and increase the electron density at the quantum level. This can suppress the stimulated emission caused by electrons not at the quantum level, increase the probability of stimulated emission caused by a recombination of electrons at the quantum level with the light holes or the heavy holes, and thus generate a gain spectrum of a wide bandwidth.

According to a second aspect of the present invention, there is provided an optical integrated circuit, comprising a semiconductor optical amplification device; and an optical functional element formed on an InP substrate of the semiconductor optical amplification device, wherein the semiconductor optical amplification device includes the InP substrate, and an active layer formed on the InP substrate, wherein the active layer has a quantum well structure formed by alternately stacking a barrier layer and a well layer, and the barrier layer is formed from a tensile-strained InGaAs film, and the well layer is formed from a compressively-strained InGaAs film.

Here, the optical functional element may be a semiconductor laser, or an optical attenuator, an optical isolator, an optical reflector, an optical switch, an optical combiner or divider, an optical light guide, an optical coupler, and other optical elements able to be formed on the InP substrate.

According to the present invention, it is possible to integrate a semiconductor optical amplification device and a semiconductor laser or other optical functional elements on the InP substrate to obtain a compact optical integrated circuit.

Therefore, it is possible to provide a semiconductor optical amplification device having a gain spectrum of a wide bandwidth and a polarization insensitive gain, and an optical integrated circuit using the semiconductor optical amplification device.

These and other objects, features, and advantages of the present invention will become more apparent from the following detailed description of the preferred embodiments given with reference to the accompanying drawings.

DESCRIPTION OF THE PREFERRED EMBODIMENTS

Below, preferred embodiments of the present invention are explained with reference to the accompanying drawings.

First Embodiment

Figure 1:
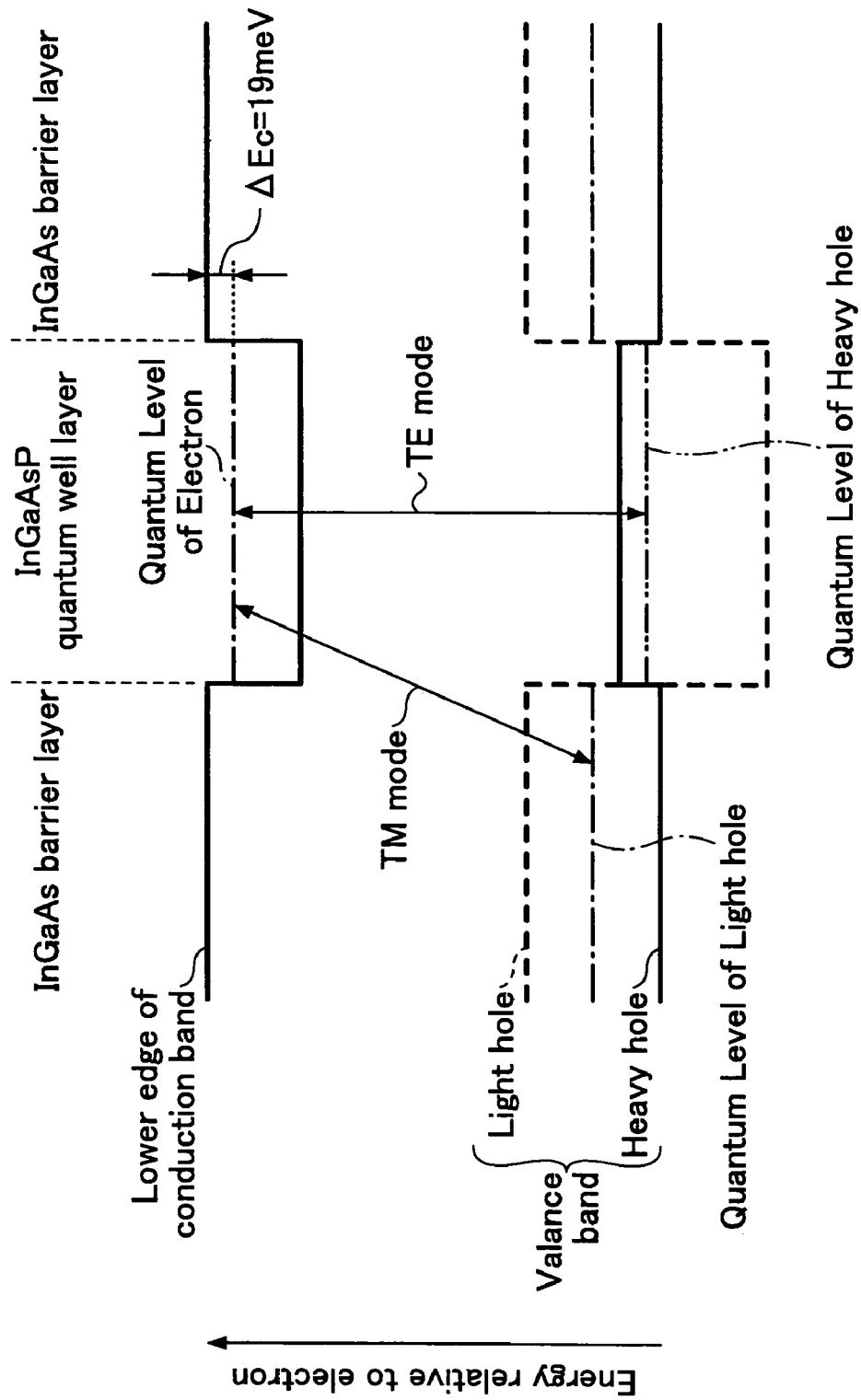
FIG. 1 is a diagram illustrating a band structure of the active layer of a semiconductor optical amplifier in the related art.
Figure 2:
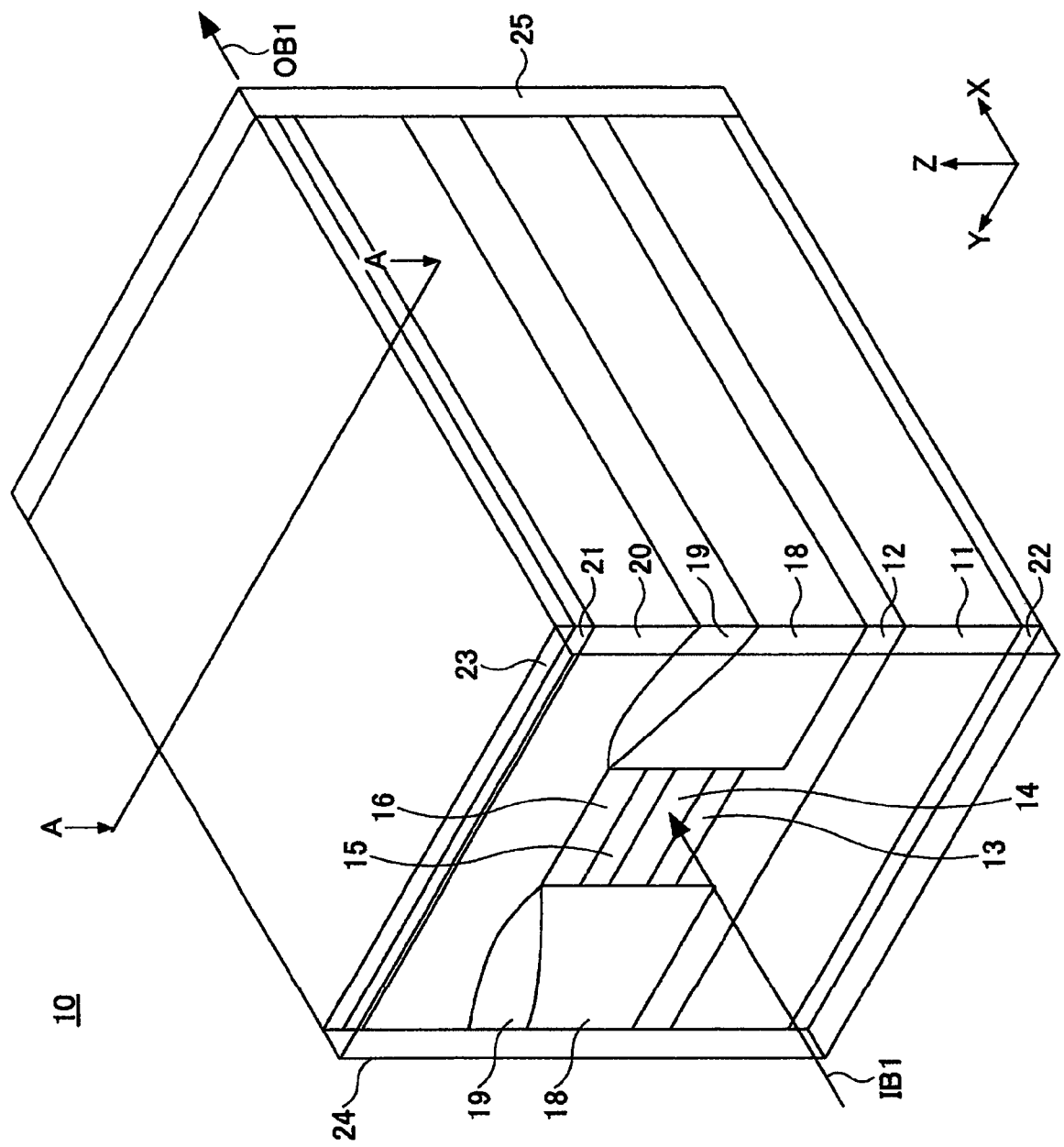
FIG. 2 is a perspective view of a semiconductor optical amplification device according to a first embodiment of the present invention.

FIG. 2 is a perspective view of a semiconductor optical amplification device according to a first embodiment of the present invention.

Figure 3:
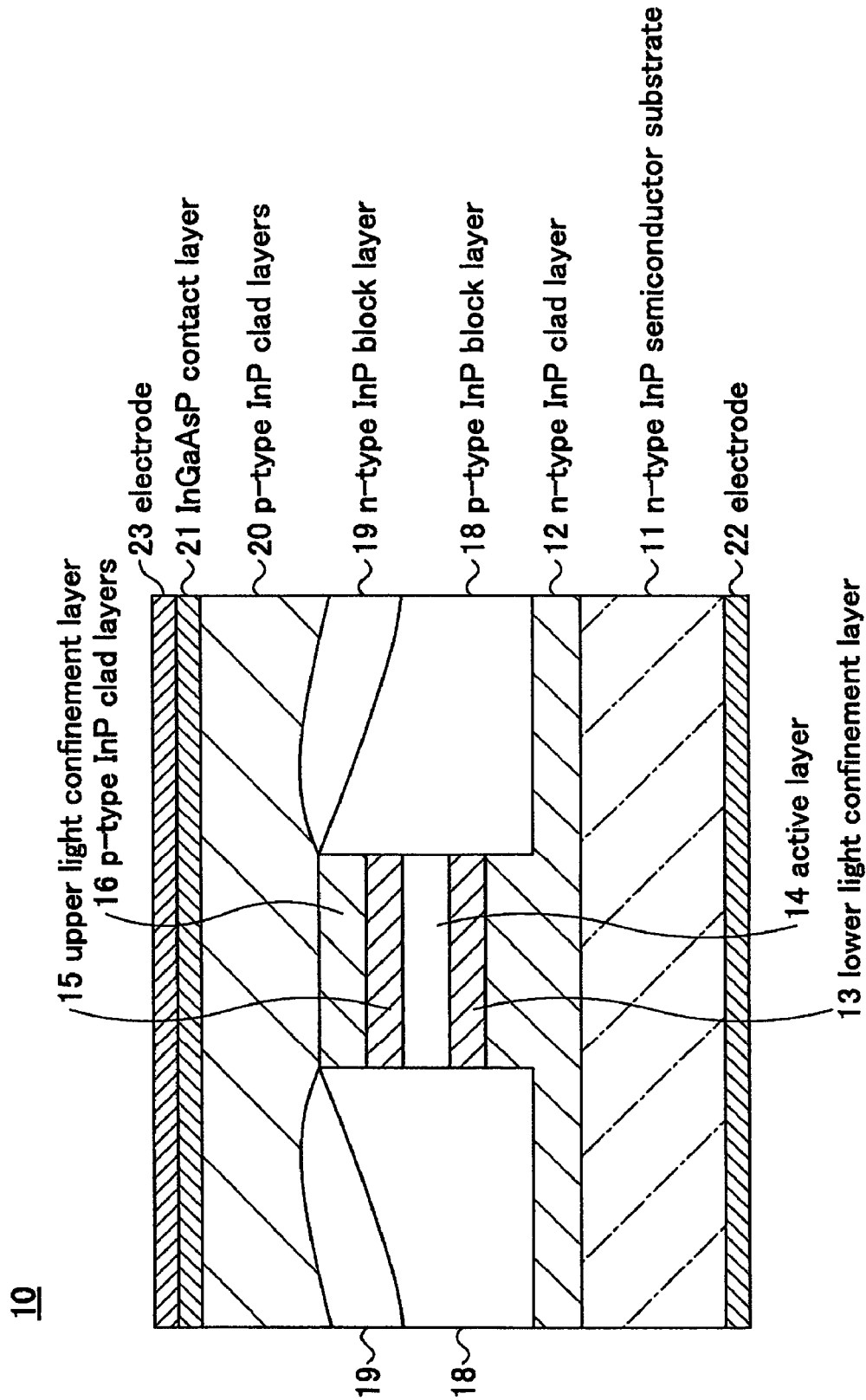
FIG. 3 is a cross-sectional view of the semiconductor optical amplification device in FIG. 2 along the line A-A in FIG. 2.

FIG. 3 is a cross-sectional view of the semiconductor optical amplification device in FIG. 2 along the line A-A in FIG. 2.

As shown in FIG. 2 and FIG. 3, a semiconductor optical amplification device 10 includes an n-type InP semiconductor substrate 11, and on the InP semiconductor substrate 11, an n-type InP cladding layer 12, a lower light confinement layer 13, an active layer 14, an upper light confinement layer 15, p-type InP cladding layers 16, 20, and an InGaAsP contact layer 21 are stacked in order.

On the n-type InP cladding layer 12, the lower light confinement layer 13, the active layer 14, and the upper light confinement layer 15 constitute a mesa structure.

At two ends of the lower light confinement layer 13, the active layer 14, and the upper light confinement layer 15, p-type InP block layers 18 and n-type InP block layers 19 are laminated on the n-type InP clad layer 12 in order. The p-type InP block layers 18 and the n-type InP block layers 19 limit a channel of current injection from electrodes 22, 23, forming a current confinement structure for enhancing the density of current flowing through the active layer 14.

The lower light confinement layer 13 and the upper light confinement layer 15 are formed from materials having a refractive index lower than the refractive indexes of barrier layers 14b1, 14b2, 14b3, 14b4, and 14b5 and well layers 14w1, 14w2, 14w3, and 14w4 of the active layer 14 (as described below in FIG. 4). For example, the lower light confinement layer 13 and the upper light confinement layer 15 are formed from i-type (non-doped) InGaAsP film.

The p-type InP block layers 18 and the n-type InP block layers 19, which are arranged at the two ends of the active layer 14, are also formed from materials having a refractive index lower than the refractive indexes of the barrier layers 14b1, 14b2, 14b3, 14b4, and 14b5 and the well layers 14w1, 14w2, 14w3, and 14w4 of the active layer 14.

With the above structure, the active layer 14 is enclosed by the lower light confinement layer 13, the upper light confinement layer 15, the p-type InP block layers 18, and the n-type InP block layers 19, to confine light in the active layer 14.

The electrodes 22, 23 are provided below the InP semiconductor substrate 11, and above the InGaAsP contact layer 21, respectively. For example, the electrodes 22, 23 are formed from conductive materials allowing formation of ohmic contact with the InP semiconductor substrate 11 and the InGaAsP contact layer 21, such as Au, Pt, or the like.

As shown in FIG. 2, an incident light beam IB1 is incident into the semiconductor optical amplification device 10, and an outgoing light beam OB1 is emitted out of the semiconductor optical amplification device 10. Anti-reflection films 24, 25 are formed on an incidence surface and an emitting surface of the semiconductor optical amplification device 10, respectively. For example, the anti-reflection films 24, 25 are formed from a silicon nitride film, or titanium oxide nitride film.

In the semiconductor optical amplification device 10, when a driving current flows in a direction from the electrode 23 to the electrode 22, the incident light beam IB1 is incident into the active layer 14 via the anti-reflection film 24. When the incident light beam IB1 propagates in the active layer 14, which extends along an X-axis as shown in FIG. 2, the light beam IB1 is increased in intensity due to stimulated emission, and then is emitted out through the emitting surface on which the anti-reflection film 25 is formed.

Figure 4:
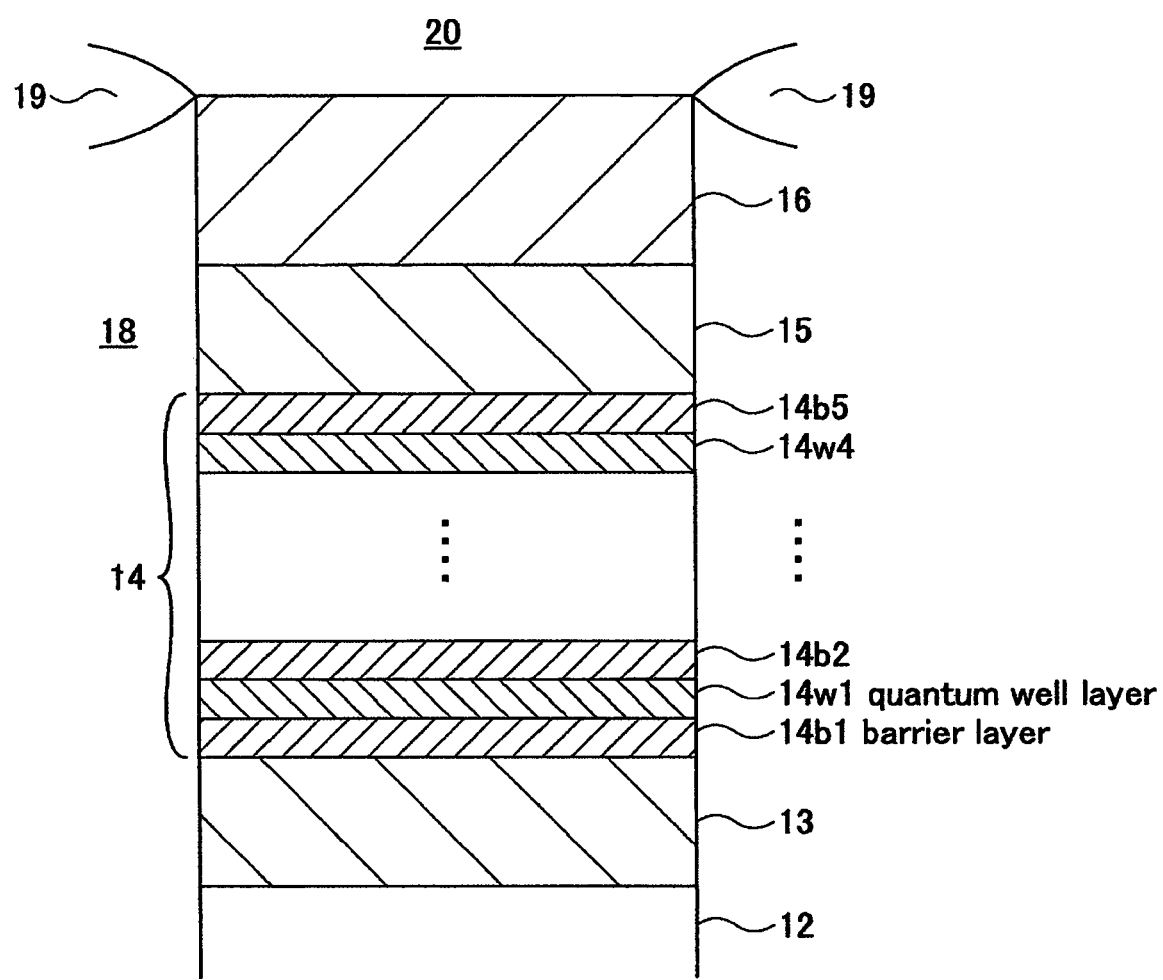
FIG. 4 is an enlarged cross-sectional view illustrating the active layer 14 of the semiconductor optical amplification device 10 in FIG. 3.

FIG. 4 is an enlarged cross-sectional view illustrating the active layer 14 of the semiconductor optical amplification device 10 in FIG. 3. In FIG. 4, some components of the semiconductor optical amplification device 10 are not illustrated for simplicity.

As shown in FIG. 4, the active layer 14 includes alternately laminated barrier layers 14b1, 14b2, 14b3, 14b4, and 14b5 (below, these barrier layers are collectively represented by "14b" where appropriate) and well layers 14w1, 14w2, 14w3, and 14w4 (below, the well layers are collectively represented by "14w" where appropriate) on the lower light confinement layer 13. Specifically, in FIG. 4, there are five barrier layers 14b1, 14b2, 14b3, 14b4, and 14b5 and four well layers 14w1, 14w2, 14w3, and 14w4, which are alternately laminated on the lower light confinement layer 13, that is, in order of the barrier layer 14b1, the well layer 14w1, the barrier layer 14b2, the well layer 14w2, the barrier layer 14b3, the well layer 14w3, the barrier layer 14b4, the well layer 14w4, and the barrier layer 14b5.

For example, each of the barrier layers 14b is formed from tensile-strained non-doped InGaAs film, and the thickness of each of the barrier layers 14b is 5 nm. The atomic composition of the InGaAs film forming each of the barrier layers 14b can be expressed as $In_{1-x}Ga_xAs$, and preferably, x satisfies $0.47 < x < 1$. In other words, with the total number of In atoms and Ga atoms being 1, preferably, the atomic ratio x of Ga in each of the barrier layers 14b satisfies $0.47 < x < 1$. When the inclusion x of Ga is 0.47, the InGaAs film has the same lattice constant as an InP film. When the inclusion x of Ga is greater than 0.47, that is, when $0.47 < x < 1$, the lattice constant of the InGaAs film is smaller than the lattice constant of the InP film, and due to this, tensile strain occurs in the InGaAs film, that is, in each of the barrier layers 14b.

For example, each of the well layers 14w is formed from compressively-strained non-doped InGaAs film, and the thickness of each of the well layers 14w is 5 nm.

The atomic composition of the InGaAs film forming each of the well layers 14w can be expressed as $In_{1-y}Ga_yAs$, and preferably, y satisfies $0 < y < 0.47$. In other words, with the total number of In atoms and Ga atoms being 1, preferably, the atomic ratio y of Ga in each of the well layers 14w satisfies $0 < y < 0.47$. When the inclusion y of Ga satisfies $0 < y < 0.47$, the lattice constant of the InGaAs film is greater than the lattice constant of the InP film, and due to this, compression strain occurs in the InGaAs film, that is, in each of the well layers 14w.

Preferably, the inclusion x of Ga in each of the barrier layers 14b and the inclusion y of Ga in each of the well layers 14w satisfy the relation that the difference between x and y is greater than or equal to 0.08 and less than 1. With such a structure, as described below, the energy difference between the electron quantum level of the well layers 14w and the lower edge of the conduction band of the barrier layers 14b (effective barrier height ΔEc) is near or higher than the thermal energy at 27° C. (26 meV), and thus, it is possible to reduce the density of electrons leaking out from the well layers 14w and residing in the barrier layers 14b.

When the difference (x−y) between the inclusion of Ga in the barrier layers 14b and the well layers 14w is greater than or equal to 0.08, it is confirmed by simulation that the effective barrier height ΔEc is greater than 26 meV in a practical range of the thickness of the well layer.

Further, it is preferable that the thickness of each of the well layers 14w is in a range from 2 nm to 10 nm. With such a thickness of the well layers 14w, it is possible to reliably set the effective barrier height ΔEc to be greater than 26 meV.

Preferably, the thickness of the active layer 14, that is, the sum of the thicknesses of the barrier layers 14b and the well layers 14w, is in a range from 15 nm to 100 nm. If the thickness of the active layer 14 is less than 15 nm, it becomes difficult to form an operable quantum well structure.

If the thickness of the active layer 14 is greater than 100 nm, a mode cross section of the semiconductor optical amplification device 10 tends to become small, and the output of the semiconductor optical amplification device 10 tends to be lowered. Here, the mode cross section of the semiconductor optical amplification device 10 is defined to be a ratio of an area of the active layer 14 to a light confinement coefficient.

The gain of the semiconductor optical amplification device 10 is influenced by the product of a gain coefficient and the light confinement coefficient. The gain coefficient is primarily determined by the structure of the active layer 14 and the band structure; the light confinement coefficient is primarily determined by the shape of the active layer 14, and the refractive index of the active layer 14 and the refractive indexes of the lower light confinement layer 13, the upper light confinement layer 15, and the p-type InP block layers 18, which enclose the active layer 14.

It should be noted that the number of the well layers 14w and the barrier layers 14b is not limited to the above example. For the purposes of setting the thickness of the active layer 14 below 100 nm, it is preferable to have 2 through 10 barrier layers 14b. For example, the number of the well layers 14w is less than the number of the barrier layers 14b by one.

Preferably, the width of the active layer 14 is in a range from 1 μm to 5 μm. When the width of the active layer 14 is less than 1 μm, fluctuations of the width of the active layer 14 may occur due to fluctuations of fabrication conditions, and the fluctuations of the width may influence the gain different between the TE mode and TM mode, that is, the PDG. On the other hand, when the width of the active layer 14 is greater than 5 μm, it becomes difficult to obtain a single guide mode.

Figure 5:
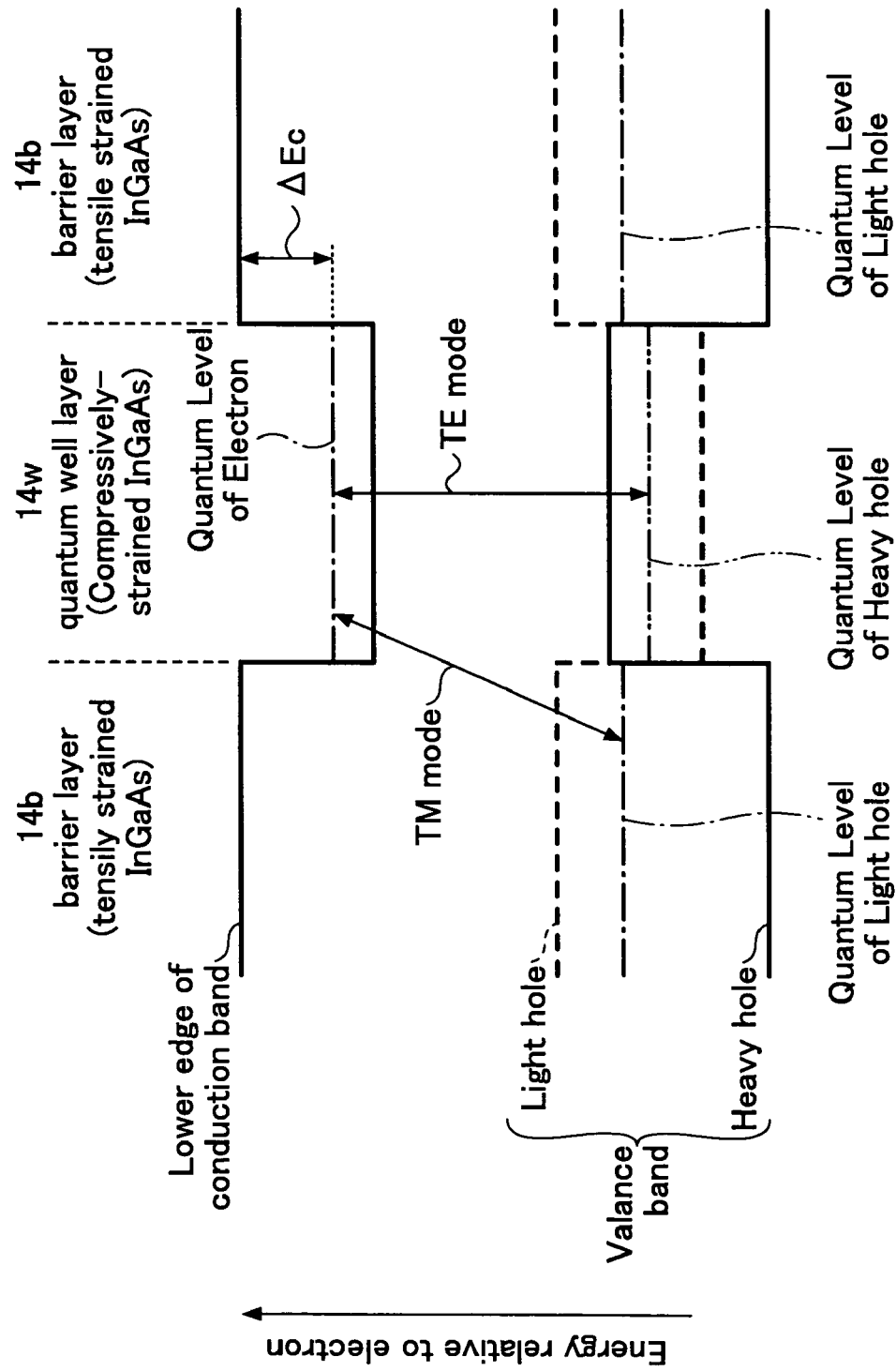
FIG. 5 is a diagram illustrating a portion of the band structure of the active layer of the semiconductor optical amplification device 10.

FIG. 5 is a diagram illustrating a portion of the band structure of the active layer of the semiconductor optical amplification device 10.

In FIG. 5, for sake of simplicity, only two barrier layers and one well layer between them are illustrated, and illustrations of other layers are omitted. In addition, in the band structure shown in FIG. 5, the energy increases in the upward direction.

As shown in FIG. 5, in the barrier layers 14b, levels of the light holes and the heavy holes are not degenerated in the valence band, and the level of the light holes is higher than the level of the heavy holes due to the tensile strain. In the meantime, in the well layer 14w, levels of the light holes and the heavy holes are not degenerated in the valence band, and the level of the heavy holes are higher than the level of the light holes due to the compression strain. As a result, in the valence band of the barrier layers 14b, quantum levels of the light holes are generated, and the light holes are distributed with the barrier layers 14b as a center. In the meantime, in the valence band of the well layer 14w, quantum levels of the heavy holes are generated, and the heavy holes are distributed with the well layer 14w as a center.

In the conduction band, because the lower edge of the conduction band of the well layer 14w is lower than the lower edge of the conduction band of the well layers 14b, quantum levels of electrons are generated in the well layer 14w, and the electrons are distributed with the well layer 14w as a center.

Because of current injection from electrodes 22, 23 as shown in FIG. 3, densities of the electrons, the light holes, and the heavy holes increase. When the incident light beam propagates in the active layer 14, the electrons in the well layers 14w combine with the light holes in the barrier layers 14b to produce stimulated emission, and this stimulated emission primarily generate a high gain coefficient of the TM mode. This recombination also contributes to the gain coefficient of the TE mode. Theoretically, the ratio of the gain coefficient of the TM mode to the gain coefficient of the TE mode is 3:1.

In the meantime, the electrons in the well layers 14w combine with the heavy holes in the well layers 14w to produce stimulated emission, and this stimulated emission primarily generate a high gain coefficient of the TE mode.

As described above, the well layer 14w is formed from InGaAs. Because InGaAs has a band gap smaller than InGaAsP, the lower edge of the conduction band of the well layer 14w can be brought to be low, thus the electron quantum level of the well layer 14w can be set low. As a result, the effective barrier height ΔEc, which is the energy difference between the electron quantum level of the well layer 14w and the lower edge of the conduction band of the barrier layer 14b, is large compared to the effective barrier height when the well layer 14w is formed from InGaAsP. Therefore, it is possible to reduce the density of electrons leaking out from the well layer 14w to the barrier layer 14b due to the thermal energy, and increase the electron density at the quantum level in the well layer 14w. This can suppress the stimulated emission caused by electrons not at the quantum level, increase the probability of stimulated emission caused by the recombination of electrons at the quantum level with the light holes or the heavy holes, and thus generate a gain spectrum of a wide bandwidth.

Here, a "band-gap" is the energy difference between the lower edge of the conduction band and the upper edge of the valence band.

According to the present embodiment, the active layer has a quantum well structure formed by alternately stacking a barrier layer and a well layer, and the barrier layer is formed from a tensile-strained InGaAs film, and the well layer is formed from a compressively-strained InGaAs film. The InGaAs well layer has a narrow energy band compared to an InGaAsP well layer. Due to this, the effective barrier height ΔEc is increased, and it is possible to generate a gain spectrum of a wide bandwidth in the semiconductor optical amplification device 10.

Below, a method of fabricating the semiconductor optical amplification device 10 is described with reference to FIG. 2 to FIG. 4.

When fabricating the semiconductor optical amplification device 10, the semiconductor films of the semiconductor optical amplification device 10 are formed on the underlying semiconductor film by epitaxial growth. There is no limitation to the method of forming the films as long as the semiconductor films can be formed by epitaxial growth. Nevertheless, it is preferable to use CVD (Chemical Vapor Deposition) rather than sputtering or other physical methods since it is possible to form large area crystals. Further, it is preferable to use MOVPE (Metal Organic Vapor Phase Epitaxy) since it allows formation of semiconductor films of good crystallinity at a low substrate temperature and at a low deposition speed. In MOVPE, a substrate is disposed in a chamber for film formation, and while heating the substrate, gases of semiconductor materials are supplied, and reactions of the gases of semiconductor materials are induced to form semiconductor films. Well-known materials can be used as the semiconductor material gases. For example, solid materials may be heated and sublimated to obtain the material gases, and liquid materials may be bubbled by carrier gases, such as Ar gas or other inert gases, and hydrogen gas, to obtain the material gases.

In the fabrication process of the semiconductor optical amplification device 10, first, on the n-type InP substrate (wafer) 11 and by MOVPE, the n-type InP clad layer 12, the lower light confinement layer 13, the active layer 14, the upper light confinement layer 15, and the p-type InP clad layers 16, 20 are grown by epitaxy in order to form a lamination structure.

Here, when forming the active layer 14, well-known materials can be used as the material gases for forming the barrier layers 14b and the well layers 14w. For example, the material gas of In may be triethyl indium, trimethyl indium, or ethyldimethyl indium. The material gas of Ga may be triethyl gallium, or trimethyl gallium. The material gas of As may be arsine, or trimethyl arsine. The composition of the barrier layers 14b and the well layers 14w can be controlled by controlling the flow rate of the material gases.

Thicknesses of the barrier layers 14b and the well layers 14w are controlled based on time periods used for film formation, which are associated with a preset film formation speed.

Next, a mesa structure including the lower light confinement layer 13, the active layer 14, the upper light confinement layer 15, and the p-type InP clad layers 16, 20 are formed. Specifically, on the surface of the above lamination structure, a not-illustrated hard mask layer is formed from a silicon oxide film or a silicon nitride film, then, a not-illustrated resist film is formed on the hard mask layer by photolithography. Then, the resist film is patterned to have the pattern of the desired mesa structure. This patterning is performed such that the region corresponding to the position of the mesa structure is not removed. Then, with the patterned resist film as a mask, the hard mask layer is etched by wet etching. After the resist film is removed, with the hard mask layer as a mask, the p-type InP clad layer 16, the upper light confinement layer 15, the active layer 14, and the lower light confinement layer 13 are etched by dry etching to expose the n-type InP clad layer 12. In this way, a stripe-shaped mesa structure is fabricated.

Next, on the n-type InP clad layer 12 at two ends of the mesa structure and by MOVPE, the p-type InP block layers 18 and the n-type InP block layers 19 are grown by epitaxy in order. The n-type InP block layers 19 are formed to have approximately the same height as the p-type InP clad layer 16.

Next, the hard mask layer is removed to expose the surface of the p-type InP clad layer 16. Then, by MOVPE, the p-type InP clad layer 20 and the InGaAsP contact layer 21 are grown by epitaxy to cover the p-type InP clad layer 16 and the n-type InP block layers 19.

Next, a conductive material allowing formation of ohmic contact with the InGaAsP contact layer 21 is deposited on the InGaAsP contact layer 21 by sputtering or laser abrasion to form the electrode 23.

Next, a conductive material allowing formation of ohmic contact with the InP semiconductor substrate 11 is deposited on the back surface of the InP semiconductor substrate 11 by sputtering or laser abrasion to form the electrode 22. Before forming the electrode 22, preferably, the back surface of the InP semiconductor substrate 11 may be ground to make the InP semiconductor substrate 11 thin.

Next, the structure fabricated so far is cut along a direction (Y direction) perpendicular to a direction (X direction) in which the above mesa structure extends to obtain a semiconductor element of a desired length. Further, the anti-reflection films 24, 25 are formed respectively on the two ends of the semiconductor element, which are exposed by the cutting, by sputtering or electron beam evaporation. For example, the anti-reflection films 24, 25 are formed from a silicon nitride film, or titanium oxide nitride film.

Next, near the center in a width direction (Y direction) of the lamination structure of the p-type InP block layers 18 and n-type InP block layers 19, the above structure is cut into individual chips along the direction (X direction) in which the active layer 14 extends.

In this way, the semiconductor optical amplification device 10 is fabricated.

According to the above method, because the barrier layers 14b and the well layers 14w are formed by using the same combination of material gases, it is possible to prevent contamination of the materials of the barrier layers 14b and the well layers 14w by other layers.

EXAMPLE 1

In this example, a semiconductor optical amplification device was fabricated which had the same structure as that of the semiconductor optical amplification device 10 shown in FIG. 2 through FIG. 4.

On the n-type InP substrate 11 and by MOVPE, the n-type InP clad layer 12 and the lower light confinement layer 13 were grown by epitaxy sequentially. The n-type InP clad layer 12 was 200 nm in thickness, and the lower light confinement layer 13 was an i-type InGaAsP film which is 50 nm in thickness.

Next, on the i-type InGaAsP film 13, the active layer 14 having a quantum well structure was formed. Specifically, by MOVPE, a 5 nm $In_{0.35}Ga_{0.65}As$ film was formed to serve as the barrier layer 14b, and a 5 nm $In_{0.57}Ga_{0.43}As$ film was formed to serve as the well layer 14w, and four $In_{0.35}Ga_{0.65}As$ films 14b and four $In_{0.57}Ga_{0.43}As$ films 14w were alternately laminated with the a fifth barrier layer 14b being on the top of the active layer lamination structure. The difference between the inclusion of Ga in the $In_{0.35}Ga_{0.65}As$ films 14b and the inclusion of Ga in the $In_{0.57}Ga_{0.43}As$ films 14w was 0.21.

When forming the barrier layers 14b and the well layers 14w, the InP semiconductor substrate 11 was heated to 620° C. With the material gas of In being sublimated trimethyl indium and the material gas of Ga being triethyl gallium, the material gas of As being arsine, the flow rates of these material gases were controlled according to the compositions of the barrier layers 14b and the well layers 14w. In thus obtained $In_{0.35}Ga_{0.65}As$ barrier layer 14b, a tensile strain equaling $-1.28\%$ was induced, and in thus obtained $In_{0.57}Ga_{0.43}As$ well layer 14w, a compressive strain equaling $+0.30\%$ was induced. These strains are determined by compositions of the barrier layers 14b and the well layers 14w.

Here, a strain was defined to be "+" when the lattice constant of a strained crystal lattice is smaller than the lattice constant of an unstrained crystal lattice, and the strain was defined to be "−" when the lattice constant of a strained crystal lattice is larger than the lattice constant of an unstrained crystal lattice.

On the active layer 14 and by MOVPE, a 50 nm i-type InGaAsP film and a 200 nm p-type InP layer were grown by epitaxy to serve the upper light confinement layer 15 and the p-type InP cladding layer 16, respectively.

On the surface of the thus formed lamination structure, a silicon oxide film was formed by CVD to cover the surface of the lamination structure. Further, by using a photo-mask, the silicon oxide film was patterned into a stripe shape of width 3.5 μm.

Next, with the patterned resist film as a mask and by ICP (Inductance coupled Plasma)-RIE (Reactive Ion Etching), dry etching was performed to expose the n-type InP cladding layer 12. In this way, the i-type InGaAsP film 13, the active layer 14, and the i-type InGaAsP film 15 were laminated to form a mesa structure 2 µm in height.

Next, the active mesa structure was buried with a p-type InP film and an n-type InP film by MOVPE, and these layers were formed at two ends of the i-type InGaAsP film 13, the active layer 14, the i-type InGaAsP film 15, and the p-type InP clad layer 16 to serve as the p-type InP block layers 18 and the n-type InP block layers 19.

Next, the silicon oxide film was removed, and then, by MOVPE, a p-type InP film serving as the p-type InP clad layer 20 and a InGaAsP film serving as the InGaAsP contact layer 21 were grown by epitaxy to cover the p-type InP clad layer 16 and the n-type InP block layers 19.

Next, an Au film, a Zn film, and an Au film were deposited on the InGaAsP film acting as the InGaAsP contact layer 21 by sputtering, and were alloyed by heat treatment.

Next, a Ti film, a Pt film, and an Au film were deposited on the back surface of the InP semiconductor substrate 11 by sputtering, and were alloyed by heat treatment.

Next, the structure fabricated so far was cut to have an element length of 600 um in the extension direction of the active layer 14, thus obtaining an array of the semiconductor optical amplification devices. Further, silicon nitride films were formed by CVD serving as the anti-reflection films 24, 25 on the two ends of the array, respectively, the ends being exposed by the cutting.

Next, the array of the semiconductor optical amplification devices was cut into individual semiconductor optical amplification device chip. In this way, the semiconductor optical amplification device 10 was fabricated.

Figure 6:
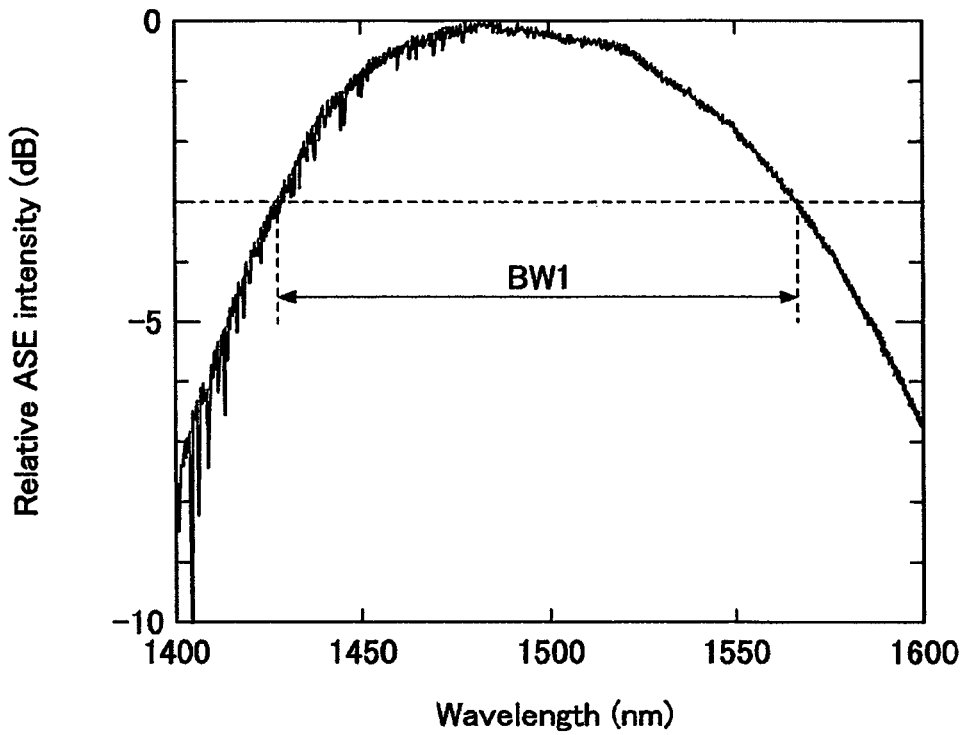
FIG. 6 is a graph showing an ASE spectrum of the TE mode in the semiconductor optical amplification device of the present example in the present embodiment.

FIG. 6 is a graph showing an ASE spectrum of the TE mode in the semiconductor optical amplification device of the present example in the present embodiment.

Figure 7:
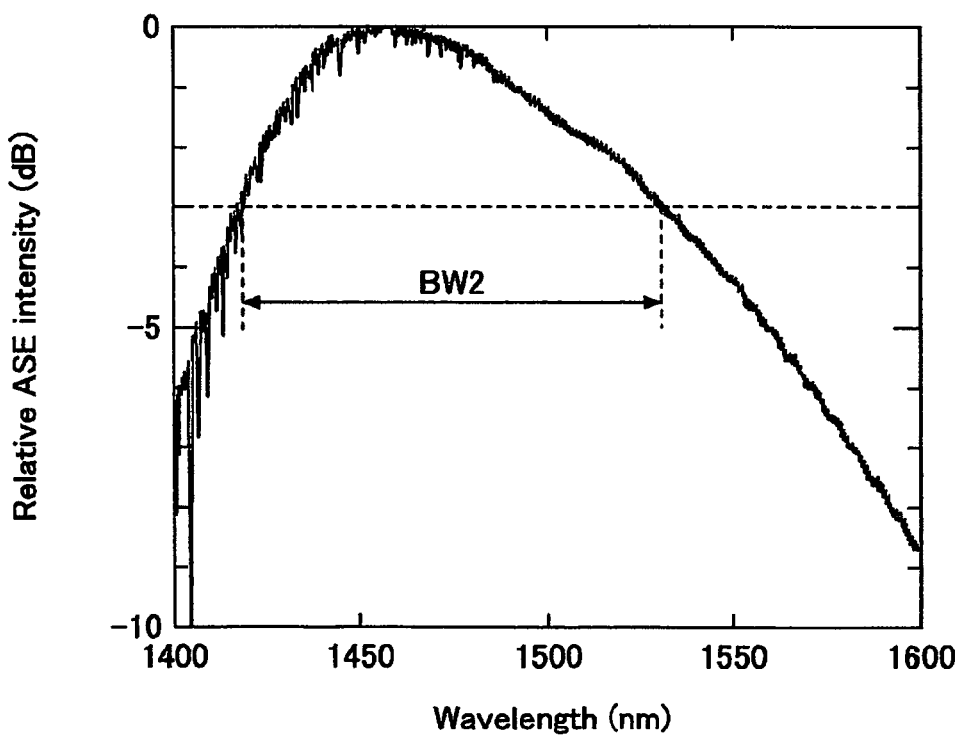
FIG. 7 is a graph showing an ASE spectrum of the TM mode in the semiconductor optical amplification device of the present example in the present embodiment.

FIG. 7 is a graph showing an ASE spectrum of the TM mode in the semiconductor optical amplification device of the present example in the present embodiment.

As shown in FIG. 6 and FIG. 7, the 3 dB bandwidth BWL of the ASE spectrum is 139 nm in the TE mode, and the 3 dB bandwidth BW2 of the ASE spectrum is 112 nm in the TM mode.

Therefore, in the semiconductor optical amplification device of the present example, the 3 dB bandwidths are much broader than that the 3 dB bandwidths of the ASE spectra in the TE mode and the TM mode in the semiconductor optical amplifier disclosed in reference 3. Thus, the semiconductor optical amplification device of the present example has much wider band gain spectrum than the semiconductor optical amplifier in the related art.

Further, in the present example, the difference of the peak gains of the TE mode and the TM mode is 1.3 dB. Thus, the polarization dependence of the gain is reduced in the present example.

EXAMPLE 2

In this example, a semiconductor optical amplification device was fabricated which had a different structure of the barrier layers and the well layers in the active layer.

Below, the method of fabricating the semiconductor optical amplification device of the present example is described with reference to FIG. 2 through FIG. 4. In the following, descriptions of the same components as in the previous example are omitted appropriately.

The active layer 14 had a quantum well structure was formed. Specifically, by MOVPE, a 5 nm $In_{0.43}Ga_{0.57}As$ film was formed to serve as the barrier layer 14b, and a 5 nm $In_{0.60}Ga_{0.40}As$ film was formed to serve as the well layer 14w, and four $In_{0.43}Ga_{0.57}As$ films 14b and four $In_{0.60}Ga_{0.40}As$ films 14w were alternately laminated with a fifth barrier layer 14b being on the top of the active layer lamination structure. The difference between the inclusion of Ga in the $In_{0.43}Ga_{0.57}As$ films 14b and the inclusion of Ga in the $In_{0.60}Ga_{0.40}As$ films 14w was 0.17.

The barrier layers 14b and the well layers 14w were formed in the same way as in the previous example. In the thus formed $In_{0.43}Ga_{0.57}As$ barrier layer 14b, a tensile strain equaling −0.70% was induced, and In the thus formed $In_{0.60}Ga_{0.40}As$ well layer 14w, a compressive strain equaling +0.50% was induced.

Then 300 nm-thick i-type InGaAsP films were formed to serve as the lower light confinement layer 13, and the upper light confinement layer 15. The p-type InP clad layer 16 was formed to be 500 nm thick on the upper light confinement layer 15. The element length was 400 nm.

Figure 8:
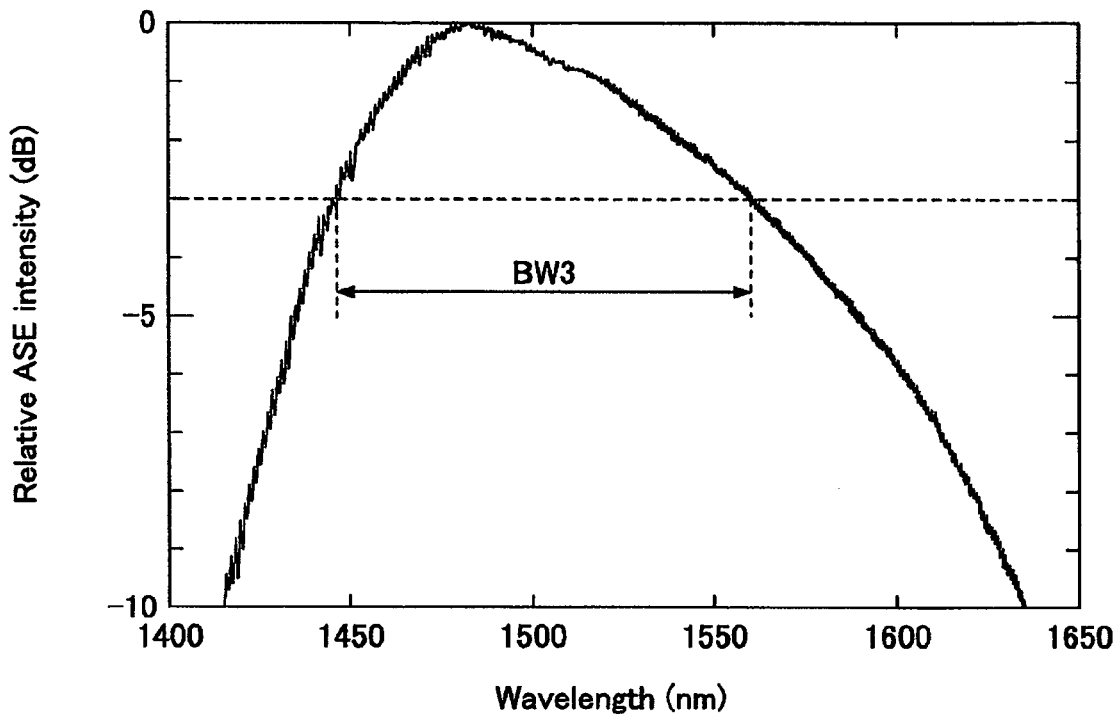
FIG. 8 is a graph showing an ASE spectrum of the TE mode in the semiconductor optical amplification device of the present example in the present embodiment.

FIG. 8 is a graph showing an ASE spectrum of the TE mode in the semiconductor optical amplification device of the present example in the present embodiment.

Figure 9:
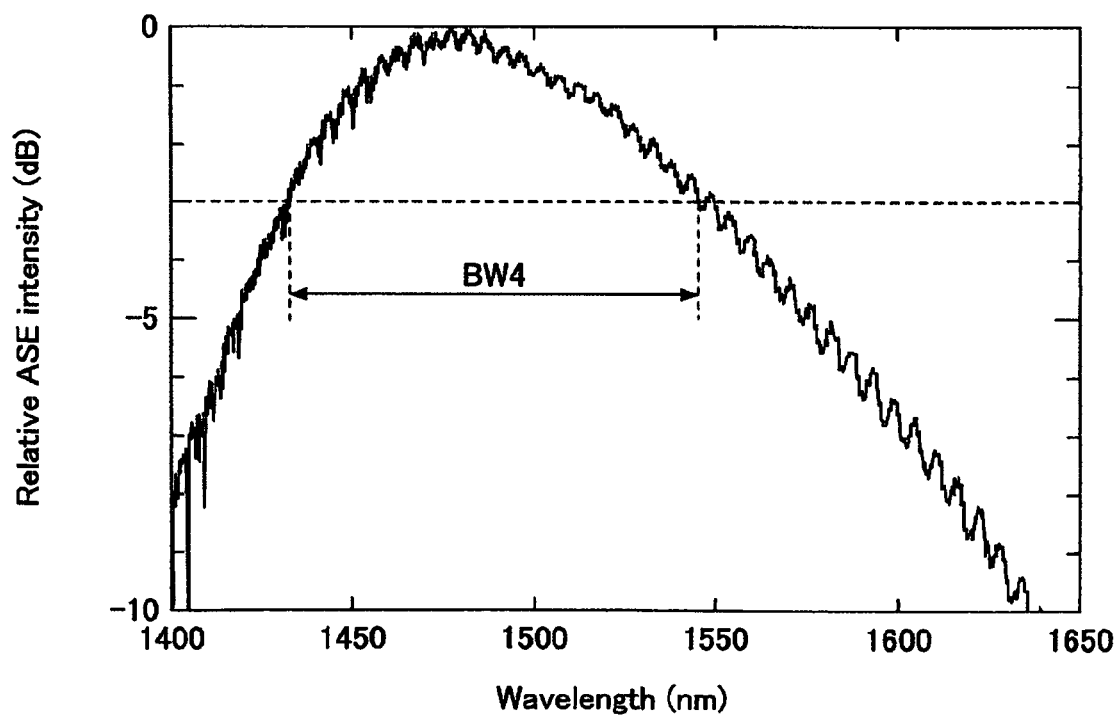
FIG. 9 is a graph showing an ASE spectrum of the TM mode in the semiconductor optical amplification device of the present example in the present embodiment.

FIG. 9 is a graph showing an ASE spectrum of the TM mode in the semiconductor optical amplification device of the present example in the present embodiment.

As shown in FIG. 8 and FIG. 9, the 3 dB bandwidth BW3 of the ASE spectrum is 117 nm in the TE mode, and the 3 dB bandwidth BW4 of the ASE spectrum is 118 nm in the TM mode. Therefore, in the semiconductor optical amplification device of the present example, the 3 dB bandwidths are much broader than that the 3 dB bandwidths of the ASE spectra of the TE mode and the TM mode in the semiconductor optical amplifier disclosed in reference 3. Thus, the semiconductor optical amplification device of the present example has a much wider band gain spectrum than the semiconductor optical amplifier in the related art.

Further, in the present example, the difference of the peak gains of the TE mode and the TM mode is 1.8 dB. Thus, the polarization dependence of the gain is reduced in the present example.

Figure 10:
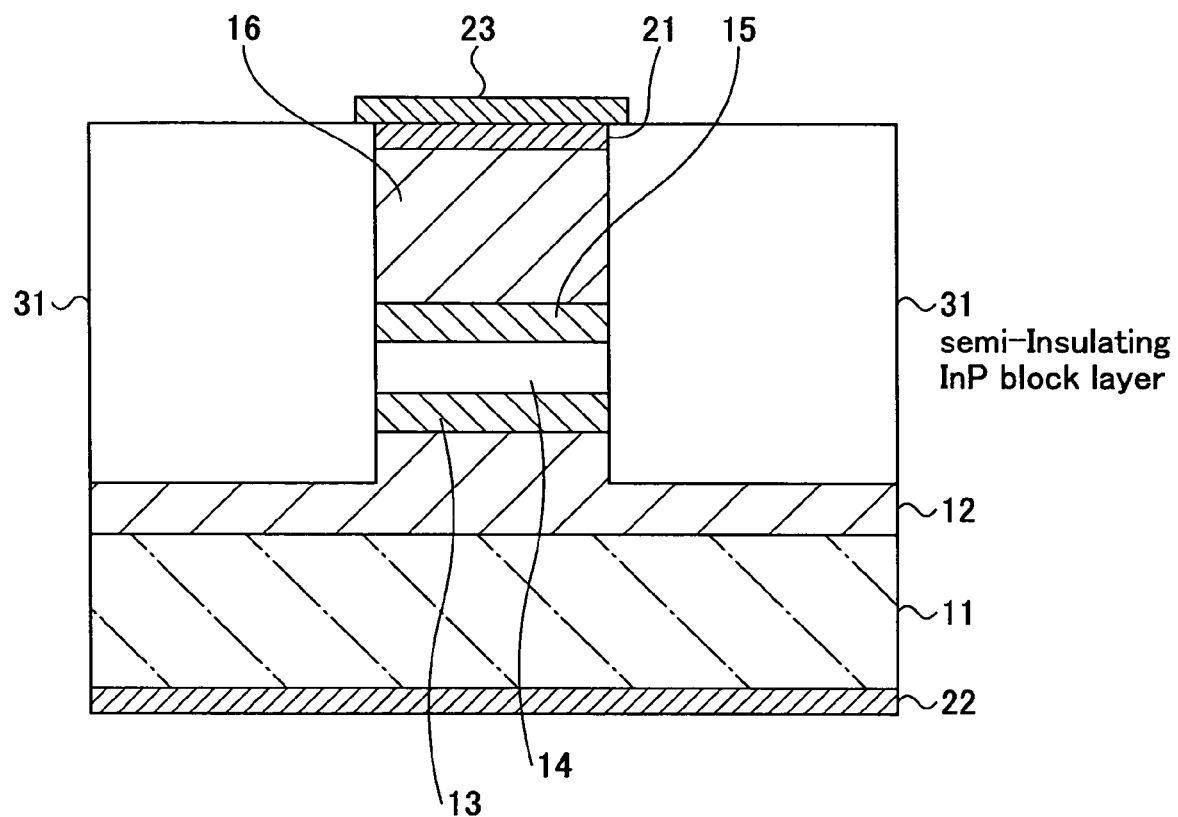
FIG. 10 is a cross-sectional view of the semiconductor optical amplification device of the present example.

FIG. 10 is a cross-sectional view of the semiconductor optical amplification device of the present example.

As shown in FIG. 10, a semiconductor optical amplification device 30 of the present example includes an n-type InP semiconductor substrate 11, and on the InP semiconductor substrate 11, an n-type InP cladding layer 12, a lower light confinement layer 13, an active layer 14, an upper light confinement layer 15, a p-type InP cladding layer 16, and an InGaAsP contact layer 21 are stacked sequentially.

At two ends of the lower light confinement layer 13, the active layer 14, and the upper light confinement layer 15, the p-type InP cladding layer 16, the InGaAsP contact layer 21, and i-type InP block layers 31 are arranged to form a current confinement structure. Electrodes 22, 23 are provided below the n-type InP semiconductor substrate 11 and above the InGaAsP contact layer 21, respectively. Although not illustrated, anti-reflection films are formed on an incidence surface and an emitting surface of the semiconductor optical amplification device 30.

The semiconductor optical amplification device 30 is basically the same as the semiconductor optical amplification device 10 except that a semi-insulating burying current confinement structure (SIBH) formed from the i-type InP block layers 31 is provided. The structure of the active layer is nearly the same as that described in the example 1. In addition, the method of fabricating the semiconductor optical amplification device 30 is similar to that described in the example 1.

The semiconductor optical amplification device 30 has the same effect as the semiconductor optical amplification device 10.

Second Embodiment

An optical integrated circuit according to a second embodiment of the present invention includes a semiconductor optical amplifier as described in the previous embodiment.

Below, a wavelength converter for converting an incident light at a wavelength $\lambda 1$ to an emitting light at a wavelength $\lambda 2$ is used as an example of the optical integrated circuit.

Figure 11:
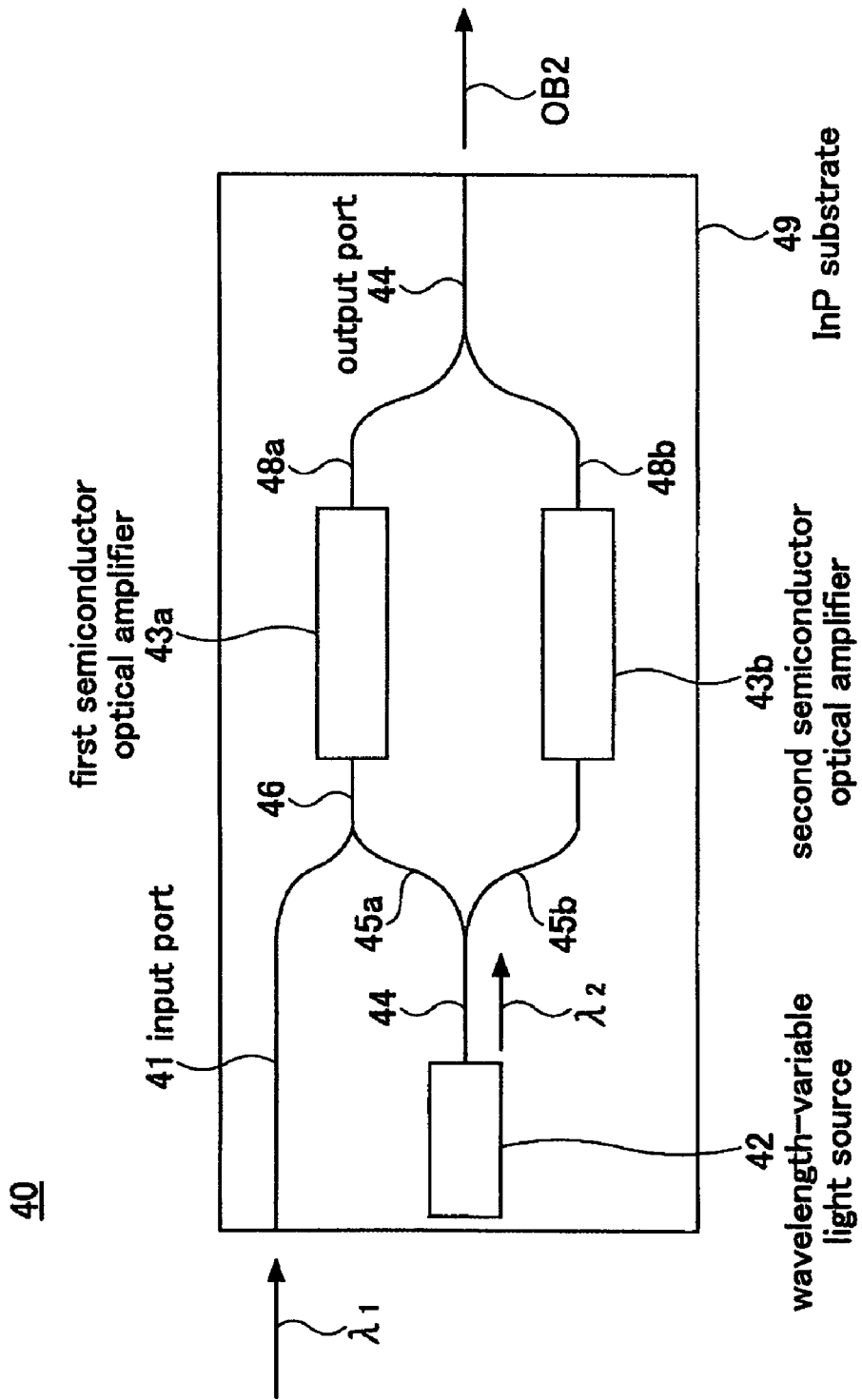
FIG. 11 is a block diagram illustrating an optical integrated circuit according to the second embodiment of the present invention.

FIG. 11 is a block diagram illustrating an optical integrated circuit according to the second embodiment of the present invention.

As shown in FIG. 11, an optical integrated circuit 40 of the present embodiment includes a light guide serving as an input port 41 for transmitting input optical signals, a wavelength-variable light source 42 that emits a light beam of a wavelength of $\lambda 2$, a first semiconductor optical amplifier 43a connected with the input port 41 and the wavelength-variable light source 42 through light guides 45a and 46, a second semiconductor optical amplifier 43b connected with the wavelength-variable light source 42 through a light guide 45b, and an output port 44 connected with the first semiconductor optical amplifier 43a and the second semiconductor optical amplifier 43b through light guides 48a, 48b, respectively.

Here, the input port 41 and the light guide 45a, and the light guides 48a and 48b are connected with the light guide 46 and the output port 44 through couplers, respectively.

The optical integrated circuit 40 may be a monolithic element formed on one piece of an n-type InP substrate 49. For example, the input port 41, the output port 44, and the light guides 45a, 45b, 46, 48a and 48b are formed from InGaAs planar light guides on the n-type InP substrate 49, which are buried with i-type InP semi-insulating cladding layers.

For example, the wavelength-variable light source 42 may be a distributed Bragg reflective wavelength variable semiconductor laser, a distributed feedback wavelength variable semiconductor laser, or other wavelength variable semiconductor lasers. Alternatively, the wavelength-variable light source 42 may be an integration of wavelength-variable lasers having different center frequencies. Such wavelength variable semiconductor lasers can be fabricated roughly in the same way as the semiconductor optical amplification device of the first embodiment. The wavelength-variable light source 42 emits an output light beam OB2 having a wavelength of $\lambda 2$. Below, the output light beam OB2 is referred to as a "conversion light".

The first semiconductor optical amplifier 43a and the second semiconductor optical amplifier 43b are the semiconductor optical amplification devices described in the previous embodiment.

Output ends of the first semiconductor optical amplifier 43a and the second semiconductor optical amplifier 43b are connected with the light guides 48a, 48b, respectively, and the light guides 48a, 48b are connected with the output port 44. Here, the first semiconductor optical amplifier 43a, the second semiconductor optical amplifier 43b, the input port 41, the output port 44, and the light guides 45a, 45b, 46, 48a and 48b constitute a Mach-Zehnder interferometer.

Next, the operation of the optical integrated circuit 40 is described.

A pulsed incident light of a wavelength $\lambda 1$ is incident into the input port 41, and further enters the first semiconductor optical amplifier 43a. From the wavelength-variable light source 42, a continuously oscillating conversion light having a wavelength $\lambda 2$ is emitted out, and is split into two portions by the light guides 45a, 45b, and enters the first semiconductor optical amplifier 43a and the second semiconductor optical amplifier 43b, respectively.

When the intensity of the incident light is zero (at "0" level of intensity modulation), the phase of the conversion light propagating through the first and second semiconductor optical amplifier 43a are the same, and they constructively interfere at optical coupler. So, in this case, the output power of the conversion light from port 44 becomes high (at "1" level). On the other hand, when the intensity of the incident light is fairly high (at "1" level of intensity modulation), the phase of conversion light propagating through the first semiconductor optical amplifier 43a is rotated by n due to the cross phase modulation effect between the incident light. Due to this, the phase-rotated conversion light from the first semiconductor optical amplifier 43a and the conversion light from the second semiconductor optical amplifier 43b destructively interfere with each other at the output port 44, and are cancelled (at "0" level). In this way, the modulation pattern (information) of the incident light of a wavelength $\lambda 1$ is transferred to the output light OB2 of a wavelength $\lambda 2$ with an inversed pattern.

According to the present embodiment, because the polarization dependence of the gain is reduced in the first semiconductor optical amplifier 43a, the influence on the cancellation ratio of the outputting light, which can be ascribed to the polarization state of the incident light, is reduced. Hence, it is possible to realize an optical integrated circuit 40 of good optical conversion efficiency.

In the present embodiment, the semiconductor layers constituting the first semiconductor optical amplifier 43a and the second semiconductor optical amplifier 43b, the light guides 45a, 45b, 46, 48a and 48b, and the wavelength-variable light source 42 can be grown by epitaxy and are integrated; hence, it is possible to produce a compact and highly-integrated optical integrated circuit 40.

Although not illustrated, electrically-active elements, such as field effect transistors, bipolar transistors, or electrically-passive elements, such as capacitors, resistors can be provided in the optical integrated circuit 40. In addition, depending on applications, the optical integrated circuit 40 may include an optical attenuator, an optical isolator, an optical deflector, an optical switch, an optical combiner or divider arranged on the InP substrate 49.

While the invention has been described with reference to specific embodiments chosen for purpose of illustration, it should be apparent that the invention is not limited to these embodiments, but numerous modifications could be made thereto by those skilled in the art without departing from the basic concept and scope of the invention.

For example, the semiconductor optical amplification device of the present invention may also be used in an optical switch or an optical modulator.

In addition, in the semiconductor optical amplification device 10 shown in FIG. 2, it is described that the active layer 14 is rectangular, and the shape of the cross section thereof is constant along the light propagation direction. The present invention is not limited to this, but the active layer 14 can be a taper shape in the width direction, that is, the width of the active layer 14 decreases gradually along the light propagation direction; the active layer 14 may also be a taper shape in the thickness direction, that is, the thickness of the active layer 14 decreases gradually along the light propagation direction. With these structures, when connecting an optical fiber to the semiconductor optical amplification device 10, it is possible to improve optical coupling efficiency with the optical fiber.

This-patent application is based on Japanese priority patent applications No. 2005-252277 filed on Aug. 31, 2005, the entire contents of which are hereby incorporated by reference.

What is claimed is:

1. A semiconductor optical amplification device, comprising:
   an InP substrate; and
   an active layer formed on the InP substrate,
   wherein the active layer has a quantum well structure formed by alternately stacking a barrier layer and a well layer which have approximately the same film thickness, and the barrier layer is formed from a tensile-strained InGaAs film, and the well layer is formed from a compressively-strained InGaAs film having a compressive strain greater than zero, and
   wherein a tensile strain of the barrier layer is greater than the compressive strain of the well layer.

2. The semiconductor optical amplification device as claimed in claim 1, wherein
   an atomic composition ratio of the InGaAs forming the barrier layer is expressed as $In_{1-x}Ga_xAs$, with x satisfying $0.47 < x < 1$, and
   an atomic composition ratio of the InGaAs forming the well layer is expressed as $In_{1-y}Ga_yAs$, with y satisfying $0 < y < 0.47$.

3. The semiconductor optical amplification device as claimed in claim 2, wherein
   a difference between x indicating inclusion of Ga in the InGaAs barrier layer and y indicating inclusion of Ga in the InGaAs well layer is greater than or equal to 0.08 and less than 1.

4. The semiconductor optical amplification device as claimed in claim 3, wherein a thickness of the well layer is in a range from 2 nm to 10 nm.

5. The semiconductor optical amplification device as claimed in claim 1, wherein an energy difference between a quantum level of the well layer and a lower edge of a conduction band of the barrier layer is greater than or equal to 26 meV.

6. The semiconductor optical amplification device as claimed in claim 1, wherein a width of the active layer is in a range from 1 μm to 5 μm.

7. The semiconductor optical amplification device as claimed in claim 1, wherein a current confinement structure is provided on the InP substrate at two ends of the active layer to concentrate an injection current into the active layer.

8. An optical integrated circuit, comprising:
   a semiconductor optical amplification device; and
   an optical functional element formed on an InP substrate of the semiconductor optical amplification device,
   wherein
   the semiconductor optical amplification device includes
   the InP substrate, and
   an active layer formed on the InP substrate, wherein the active layer has a quantum well structure formed by alternately stacking a barrier layer and a well layer which have approximately the same film thickness, the barrier layer is formed from a tensile-strained InGaAs film, and the well layer is formed from a compressively-strained InGaAs film having a compressive strain greater than zero, and wherein a tensile strain of the barrier layer is greater than the compressive strain of the well layer.

* * * * *